(12) United States Patent
Wu et al.

(10) Patent No.: US 7,504,270 B2
(45) Date of Patent: Mar. 17, 2009

(54) METHODS OF QUANTIFYING VARIATIONS RESULTING FROM MANUFACTURING-INDUCED CORNER ROUNDING OF VARIOUS FEATURES, AND STRUCTURES FOR TESTING SAME

(75) Inventors: David D. Wu, Austin, TX (US); Mark W. Michael, Cedar Park, TX (US); Akif Sultan, Austin, TX (US); Jingrong Zhou, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 178 days.

(21) Appl. No.: 11/425,913

(22) Filed: Jun. 22, 2006

(65) Prior Publication Data

US 2007/0298524 A1    Dec. 27, 2007

(51) Int. Cl.
*G10R 31/26* (2006.01)
*H01L 21/66* (2006.01)
(52) U.S. Cl. ............................ 438/17; 438/14; 438/18; 257/48; 257/E21.521
(58) Field of Classification Search ................ 438/14, 438/18, 17; 257/E21.521, 48
See application file for complete search history.

(56) References Cited

U.S. PATENT DOCUMENTS 5,986,283 A * 11/1999 Bush et al. .................... 257/48

* cited by examiner

*Primary Examiner*—W. David Coleman
*Assistant Examiner*—Shaka Scarlett
(74) *Attorney, Agent, or Firm*—Williams, Morgan & Amerson, P.C.

(57) ABSTRACT

The present invention is directed to methods of quantifying variations resulting from manufacturing-induced corner rounding of various features, and structures for testing same. In one illustrative embodiment, the method includes forming a plurality of test structures on a semiconducting substrate, each of the test structures having at least one physical dimension that varies relative to the other of the plurality of test structures, at least some of the test structures exhibiting at least some degree of manufacturing-induced corner rounding, forming at least one reference test structure, performing at least one electrical test on the plurality of test structures and on the reference test structure to thereby produce electrical test results, and analyzing the test results to determine an impact of the manufacturing-induced corner rounding on the performance of the plurality of test structures.

16 Claims, 6 Drawing Sheets

METHODS OF QUANTIFYING VARIATIONS RESULTING FROM MANUFACTURING-INDUCED CORNER ROUNDING OF VARIOUS FEATURES, AND STRUCTURES FOR TESTING SAME

BACKGROUND OF THE INVENTION

1. Field of the Invention

The present invention is generally directed to the field of manufacturing semiconductor devices, and, more particularly, to methods of quantifying variations resulting from manufacturing-induced corner rounding of various features, and structures for testing same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors. However, the dimensions of modern semiconductor devices have, in some cases, been reduced below the wavelength of photolithography systems employed in the process of forming such features. In some cases, some features, such as, for example, gate electrode structures and active areas, are formed with corner regions. Due to the very small size of modern device features, and the limits of existing photolithography systems, devices may be formed with rounded corners, i.e., manufacturing-induced corner rounding.

FIGS. 1A-1B will be referenced to described the problems associated with manufacturing-induced corner rounding in connection with the formation of an illustrative gate electrode structure. FIG. 1A depicts an idealized gate electrode 10 comprised of a plurality of corner regions 12 and a gate contact 14. The gate electrode 10 has a critical dimension 16 in the area adjacent the corner regions 12 and a critical dimension 18 in portions of the gate electrode 10 remote from the corner regions 12. Ideally, the dimensions 16 and 18 are the same along the entire length of the gate electrode structure 10. FIG. 1B is an enlarged view of a gate electrode structure 10A that reflects some manufacturing-induced corner rounding 12A due to manufacturing processes. Depending upon the magnitude of the corner rounding, the dimension 16A of the gate electrode 10A may be significantly greater than the dimension 18A of the gate electrode structure 10A at distances remote from the corners 12A. Such dimensional variations can be problematic in modern, highly scaled transistor devices. For example, dimensional width variations of the gate electrode along its length may lead to the creation of non-uniform electric fields during the operation of a transistor, thereby impacting device performance.

FIGS. 2A-2B depict problems that manufacturing-induced corner rounding may cause in forming active regions in a substrate. Such active regions are typically formed by performing one or more ion implantation processes through a patterned layer of photoresist material. As shown in FIG. 2A, the active area 20 has a generally L-shaped configuration with a corner 22. FIG. 2B depicts an active area 20A exhibiting manufacturing-induced corner rounding 22A due to the manufacturing processes used to form the active area 20A. Such dimensional variations in the active area can also adversely affect device performance. For example, due to manufacturing-induced corner rounding, the area of the active area 20A may be less than or greater than the area anticipated by the design process, which, in turn, may adversely affect device performance.

The present invention is directed to various methods and systems that may solve, or at least reduce, some or all of the aforementioned problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to methods of quantifying variations resulting from manufacturing-induced corner rounding of various features, and structures for testing same. In one illustrative embodiment, the method comprises forming a plurality of test structures on a semiconducting substrate, each of the test structures having at least one physical dimension that varies relative to the other of the plurality of test structures, at least some of the test structures exhibiting at least some degree of manufacturing-induced corner rounding, forming at least one reference test structure, performing at least one electrical test on the plurality of test structures and on the reference test structure to thereby produce electrical test results, and analyzing the test results to determine an impact of the manufacturing-induced corner rounding on the performance of the plurality of test structures.

In another illustrative embodiment, the method comprises forming a plurality of test structures on a semiconducting substrate, each of the test structures having at least one physical dimension that varies relative to the other of the plurality of test structures, at least some of the test structures exhibiting at least some degree of manufacturing-induced corner rounding, forming a plurality of reference test structures, performing at least one electrical test on the plurality of test structures and on the plurality of reference test structures to thereby produce electrical test results and analyzing the test results to determine an impact of the manufacturing-induced corner rounding resulting from manufacturing operations on the performance of the plurality of test structures.

In yet another illustrative embodiment, the method comprises forming a plurality of gate electrode test structures on a semiconducting substrate for testing an impact of corner rounding resulting from manufacturing operations, each of the gate electrode test structures having at least one physical dimension that varies relative to the other of the plurality of gate electrode test structures, at least some of the gate electrode test structures exhibiting at least some degree of manufacturing-induced corner rounding, forming a plurality of active area test structures on a semiconducting substrate for testing an impact of corner rounding resulting from manufacturing operations, each of the active area test structures having at least one physical dimension that varies relative to the other of the plurality of active area test structures, at least some of the active area test structures exhibiting at least some degree of manufacturing-induced corner rounding, forming at least one reference test structure, performing at least one electrical test on the plurality of gate electrode test structures, the plurality of active area test structures and on the reference test structure to thereby produce electrical test results, analyzing the test results to determine an impact of the manufacturing-induced corner rounding on the performance of the plurality of gate electrode test structures, and analyzing the test results to determine an impact of the manufacturing-induced corner rounding on the performance of the plurality of active area test structures.

BRIEF DESCRIPTION OF THE DRAWINGS

The invention may be understood by reference to the following description taken in conjunction with the accompanying drawings, in which like reference numerals identify like elements, and in which.

Figure 1A:
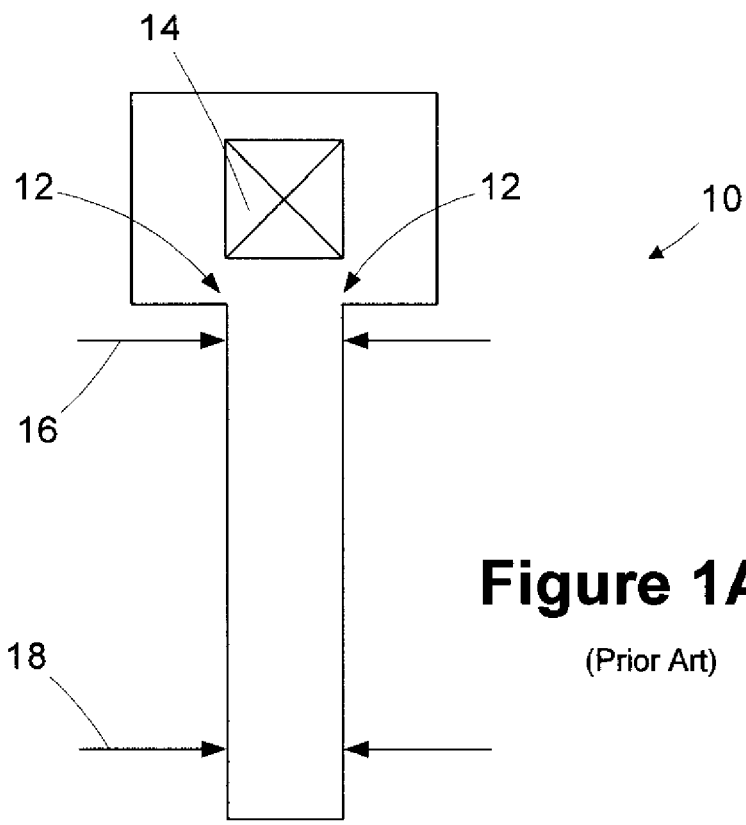
FIGS. 1A-1B depict an illustrative prior art gate electrode structure.
Figure 1B:
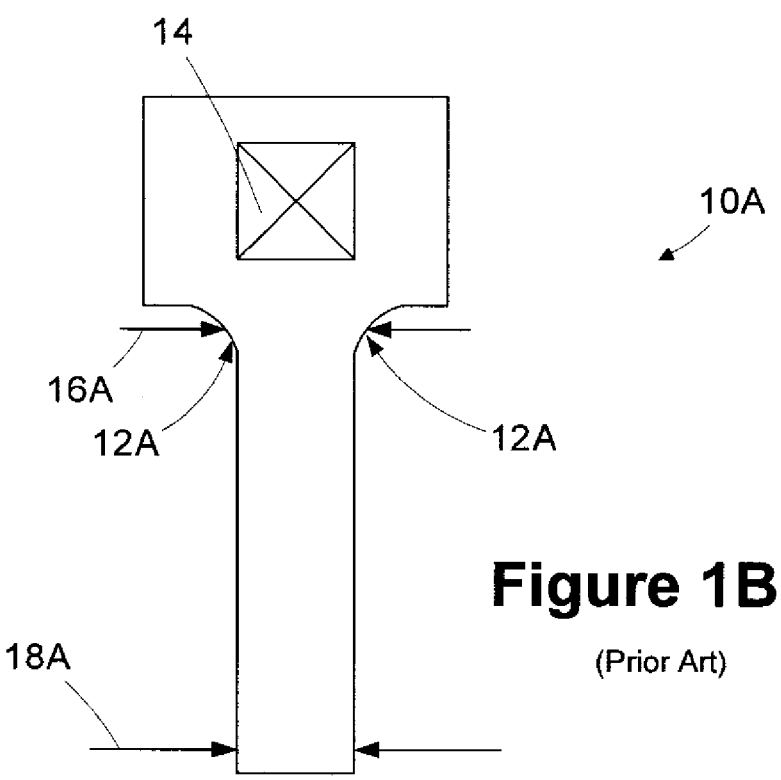
Figure 2A:
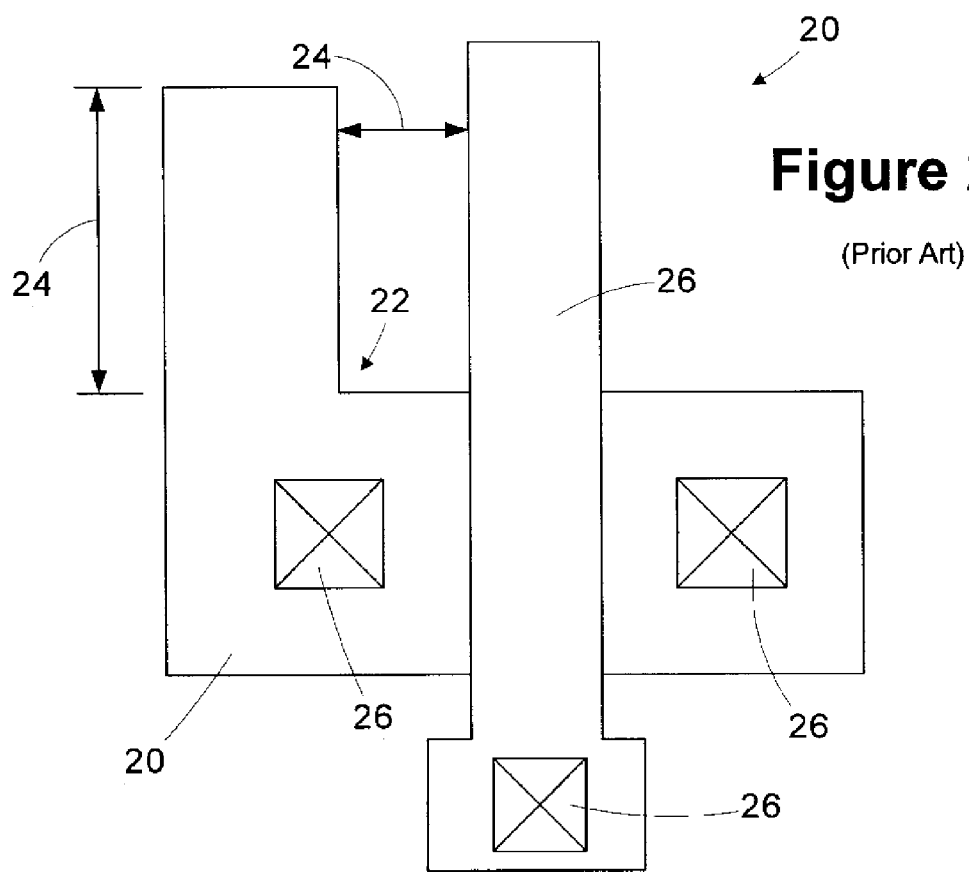
FIGS. 2A-2B depict an illustrative prior art active area feature.
Figure 2B:
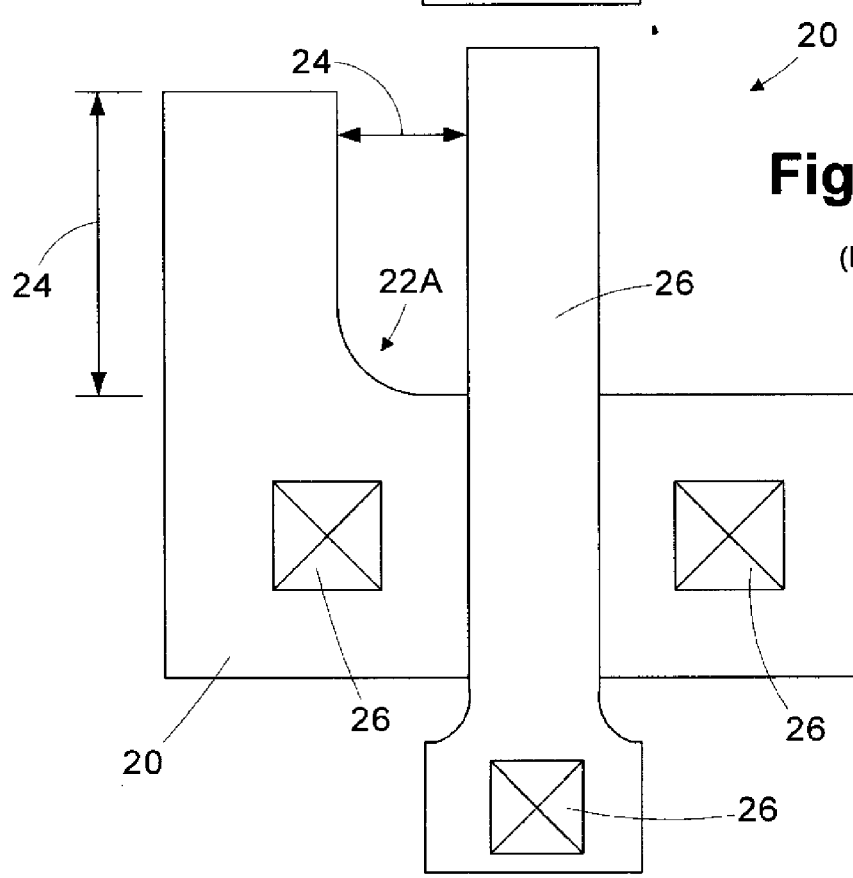

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 3:
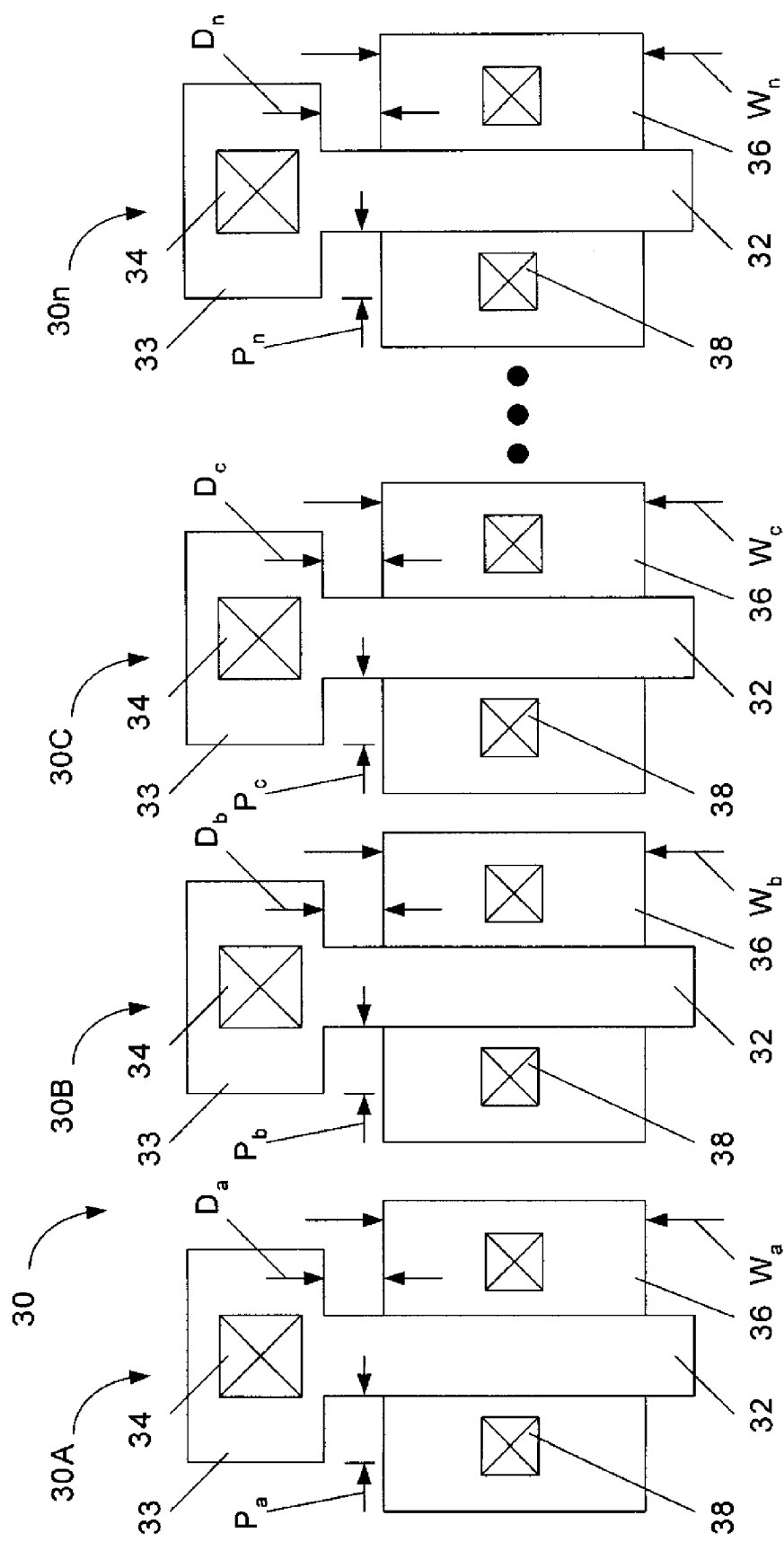
FIG. 3 depicts a plurality of illustrative test structures that may be formed in accordance with various aspects of the present invention.
Figure 4:
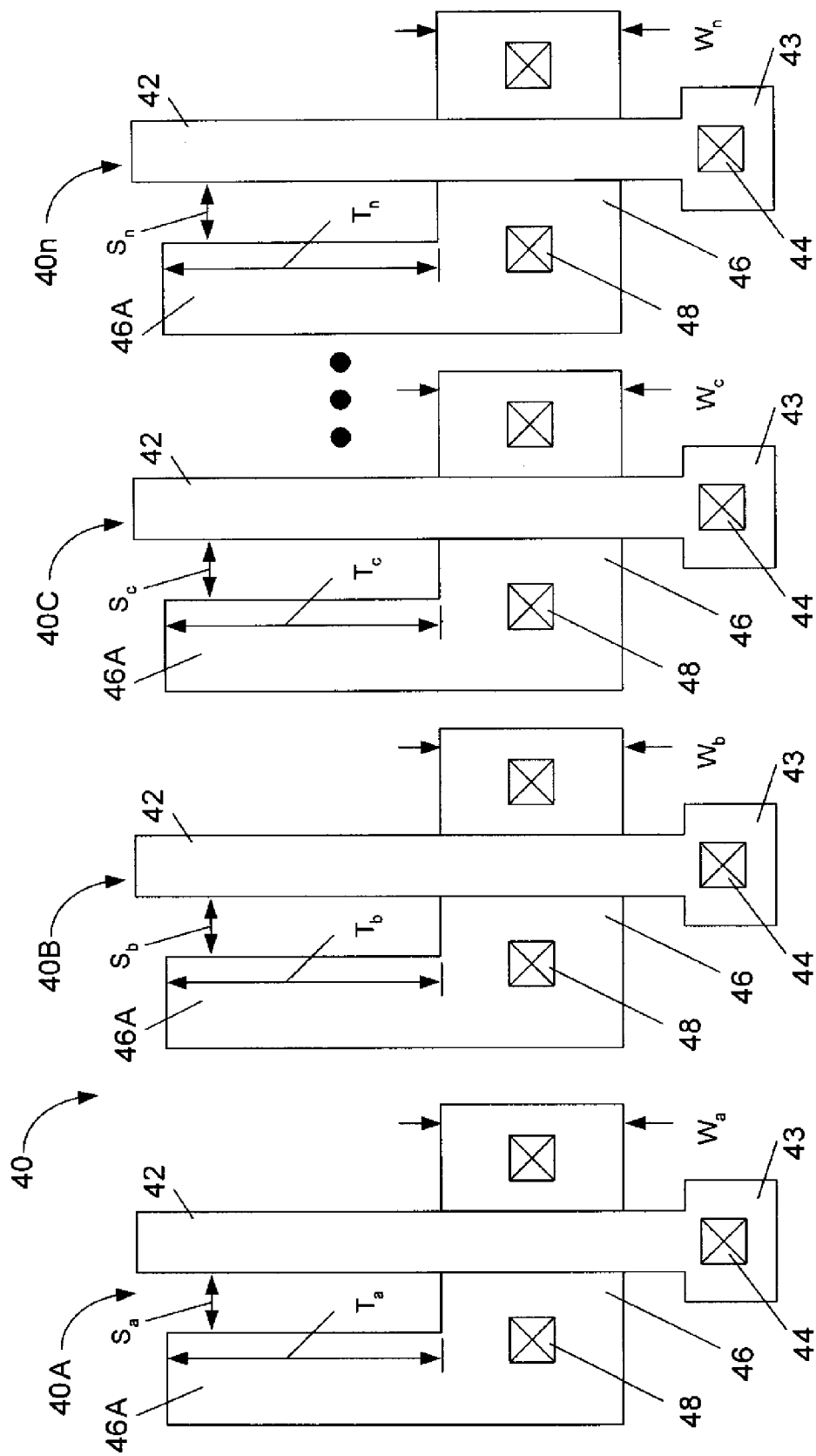
FIG. 4 depicts yet another plurality of illustrative test structures that may be formed in accordance with various aspects of the present invention.
Figure 5:
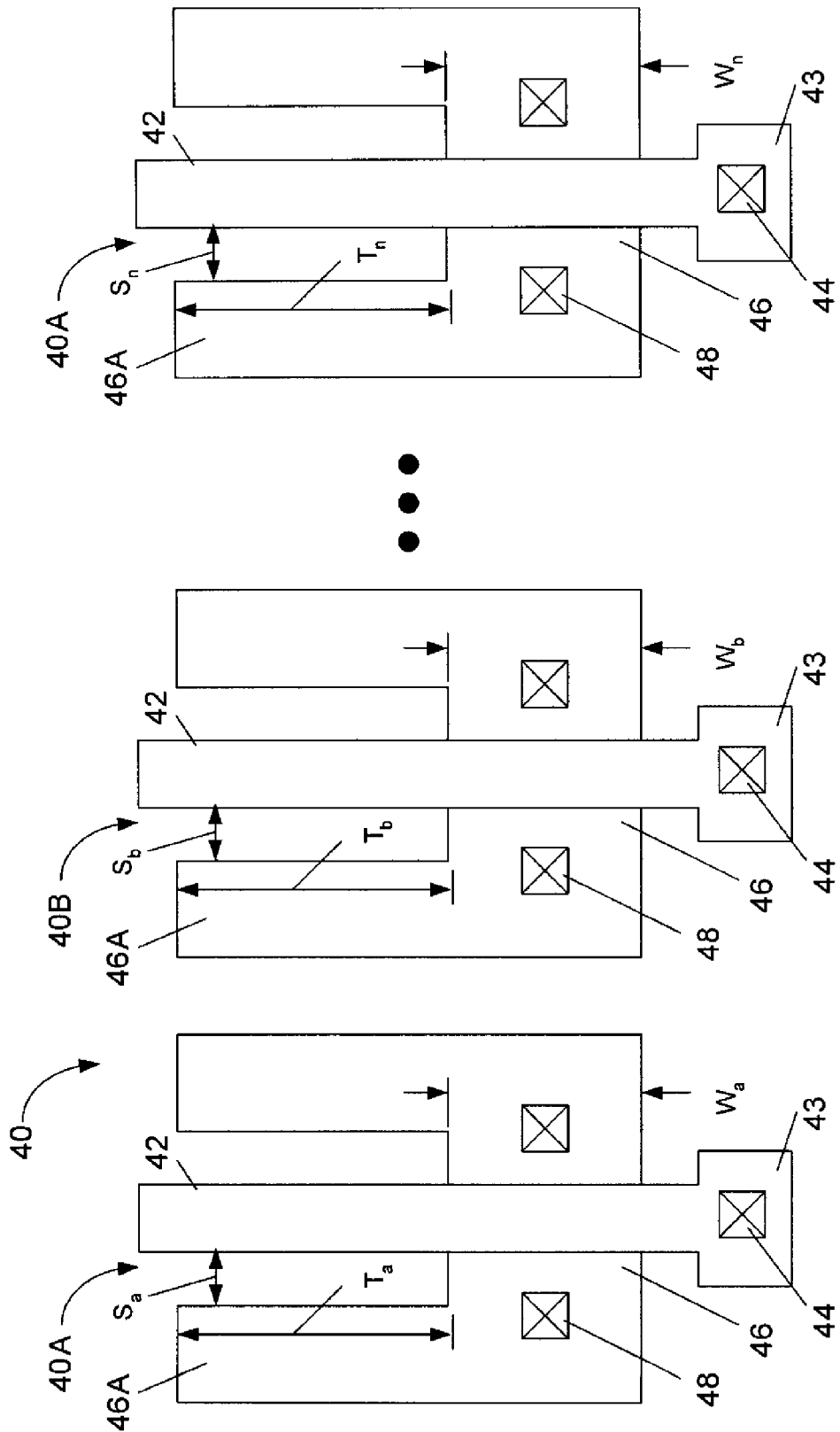
FIG. 5 depicts yet another plurality of illustrative test structures that may be formed in accordance with various aspects of the present invention.

FIGS. 3, 4 and 5 depict a plurality of illustrative test structures 30, 40 that may be formed in accordance with various aspects of the present invention. Of course, the illustrative test structures 30, 40 depicted herein are provided by way of example only and should not be considered a limitation of the present invention. In general, in one illustrative aspect, an array of the test structures 30 and/or 40 may be formed on a semiconducting substrate and evaluated to quantify variations due to the rounding of corners of a feature during manufacturing operations, i.e., manufacturing-induced corner rounding. In some applications, only the test structures 30 may be employed, while in other cases only the test structures 40 may be used. In other cases, both the test structures 30 and 40 may be formed above the same substrate.

For ease of reference, the test structures 30, 40 shown herein do not depict any manufacturing-induced corner rounding. When the test structures 30, 40 are formed, at least some of the structures 30, 40 will exhibit at least some degree of manufacturing-induced corner rounding. Of course, it is not required that all of the test structures 30, 40 exhibit manufacturing-induced corner rounding, although that may occur in some situations. The degree of manufacturing-induced corner rounding may vary depending upon the relevant physical dimensions of the various test structures 30, 40.

Figure 6:
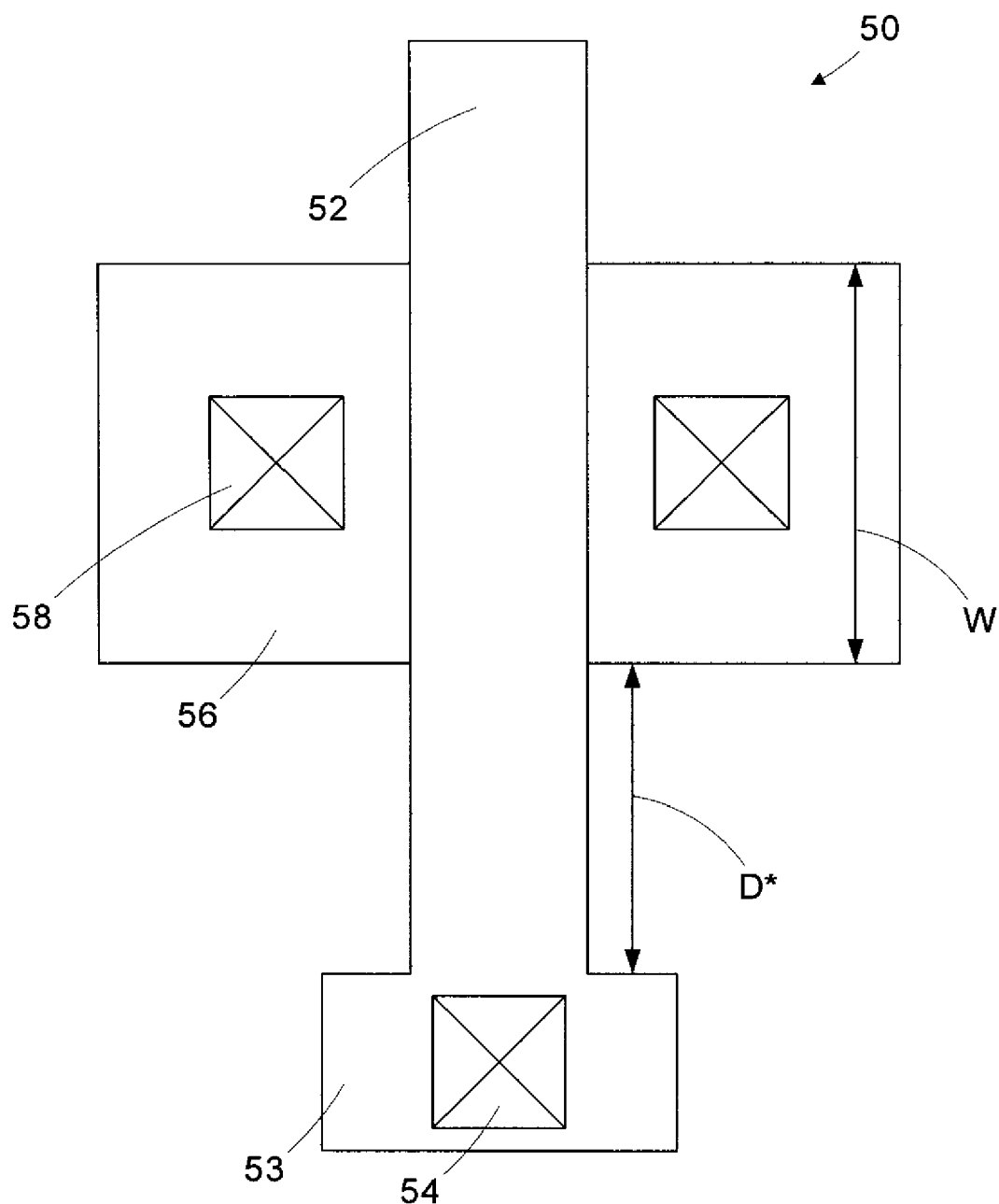
FIG. 6 depicts an illustrative reference structure that may be employed with various aspects of the present invention.

FIG. 6 depicts an illustrative reference test structure 50 that may be employed in performing various aspects of the present invention. Of course, the reference test structure 50 depicted in FIG. 6 is provided by way of example only, and the present invention should not be considered as limited to the illustrative embodiment shown herein. One or more of the reference test structures 50 may also be formed on the substrate.

As shown in FIG. 3, a plurality of gate electrode test structures 30 may be formed on a semiconducting substrate (not shown). In the illustrative example depicted in FIG. 3, the test structure 30 comprises a gate electrode structure 32, a gate electrode contact 34, an active area 36 and a plurality of active area contacts 38. In FIG. 3, a plurality of such test structures, 30A, 30B, 30C, . . . 30n, may be provided on a semiconducting substrate. The exact number of the test structures 30 may vary depending upon the particular application in which the present invention is employed. As indicated in FIG. 3, the active area 36 has a width W ($W_a$, $W_b$, $W_c$, . . . $W_n$) and it is spaced apart from the contact portion 33 of the gate electrode structure 32 by a distance D ($D_a$, $D_b$, $D_c$, . . . $D_n$). The contact portion 33 of the gate electrode structure 32 is offset from the gate electrode portion by a distance P ($P_a$, $P_b$, $P_c$, . . . $P_n$). In FIG. 3, each of these dimension is provided with its corresponding subscript for each of the individual test structures 30A-30n. As indicated in FIG. 3, any desired number of the test structures 30 may be formed above a substrate.

As shown in FIG. 4, a plurality of active region test structures 40 may be formed on a semiconducting substrate (not shown). In the illustrative example depicted in FIG. 4, the active area test structures 40 comprises a gate electrode structure 42, a gate electrode contact 44, an L-shaped active area 46 and a plurality of active area contacts 48. In FIG. 4, a plurality of such test structures, 40A, 40B, 40C, . . . 40n, may be provided on a semiconducting substrate. The exact number of the test structures 40 may vary depending upon the particular application in which the present invention is employed. As indicated in FIG. 4, the active area 46 has a width W ($W_a$, $W_b$, $W_c$, ... $W_n$) and it is spaced apart from the gate electrode 42 by a distance S ($S_a$, $S_b$, $S_c$, ... $S_n$). The elongated portion 46a of the active area 46 has a length T ($T_a$, $T_b$, $T_c$, ... $T_n$). In FIG. 4, each of these dimension is provided with its corresponding subscript for each of the individual test structures 40A-40n. As indicated in FIG. 4, any desired number of the test structures 40 may be formed above a substrate. FIG. 5 depicts an alternative embodiment of test structures 40 similar to those depicted in FIG. 4. The test structures 40 depicted in FIG. 5 have a generally U-shaped active area 48.

FIG. 6 depicts an illustrative reference test structure 50 that may be employed in accordance with various aspects of the present invention. As indicated therein, the reference test structure 50 comprises a gate electrode structure 52, a gate contact 54, an active area 56 and a plurality of active area contacts 58. Of course, the reference test structure 50 depicted in FIG. 5 is provided by way of example only and the details depicted therein should not be considered a limitation of the present invention. Any number of the reference test structures 50 may be formed above a particular substrate as will be described more fully below. The active area 56 of the reference structure 50 has a width W that corresponds to the width W of the test structures 30 and 40 described previously. The reference test structure 50 is formed such that the contact portion 53 of the gate electrode structure 52 is spaced from the active area 56 by a distance D*. The dimension D* may vary depending upon the particular application but it is generally much larger than the dimension D indicated in FIG. 3. For example, the dimension D* may be approximately 0.5 micron or greater. The purpose of making the dimension D* so large is to mitigate or reduce the effect of corner rounding on the test structures 50 that may occur when the test structure 50 is formed.

To determine the effects of corner rounding, a plurality of test structures 30 and/or 40 are formed above a semiconducting substrate along with at least one of the reference test structures 50. The dimensions P and D may vary for each of the test structures 30. Similarly, if employed, the dimensions S and T on the test structures 40 will also vary among the test structures 40. If desired, a plurality of reference test structures 50 may be formed so that information obtained from measuring electrical characteristics of a plurality of test structures 50 may be averaged so as to increase confidence in the data used for reference purposes. By measuring electrical test characteristics of the plurality of test structures 30 and/or the plurality of the test structures 40 and comparing that to the reference data obtained from measuring the one or more reference test structures 50, the effects of corner rounding due to manufacturing processes may be quantified. As indicated above, the degree of manufacturing-induced corner rounding may vary among the test structures 30 and/or 40 depending upon differences in their relative physical dimensions. Electrical parameters, such as drive current, resistance, leakage current, etc. may be employed for evaluation purposes.

More specifically, by obtaining data from testing the plurality of test structures 30, information may be obtained that will allow circuit designers to try to compensate for degradation in device performance due to manufacturing-induced corner rounding. Even more specifically, in one illustrative embodiment, measurement data obtained from testing the structures 30 may be charted against various combinations of the dimensions P, D and W, or a subset thereof, e.g., two of the dimensions, or one of the dimensions. With such information, design engineers may be able to design circuits to avoid, reduce or at least account for the effects of manufacturing-induced corner rounding, once such effects are quantified through use of the present invention. A similar process can be performed using data obtained from the test structures 40 and the dimensions W, T and S of such structures.

Generally, the present invention is directed to methods of quantifying variations resulting from manufacturing-induced corner rounding of various features, and structures for testing same. In one illustrative embodiment, the method comprises forming a plurality of test structures on a semiconducting substrate, each of the test structures having at least one physical dimension that varies relative to the other of the plurality of test structures, at least some of the test structures exhibiting at least some degree of manufacturing-induced corner rounding, forming at least one reference test structure, performing at least one electrical test on the plurality of test structures and on the reference test structure to thereby produce electrical test results, and analyzing the test results to determine an impact of the manufacturing-induced corner rounding on the performance of the plurality of test structures.

In another illustrative embodiment, the method comprises forming a plurality of gate electrode test structures on a semiconducting substrate for testing an impact of corner rounding resulting from manufacturing operations, each of the gate electrode test structures having at least one physical dimension that varies relative to the other of the plurality of gate electrode test structures, at least some of the gate electrode test structures exhibiting at least some degree of manufacturing-induced corner rounding, forming a plurality of active area test structures on a semiconducting substrate for testing an impact of corner rounding resulting from manufacturing operations, each of the active area test structures having at least one physical dimension that varies relative to the other of the plurality of active area test structures, at least some of the active area test structures exhibiting at least some degree of manufacturing-induced corner rounding, forming at least one reference test structure, performing at least one electrical test on the plurality of gate electrode test structures, the plurality of active area test structures and on the reference test structure to thereby produce electrical test results, analyzing the test results to determine an impact of the manufacturing-induced corner rounding on the performance of the plurality of gate electrode test structures, and analyzing the test results to determine an impact of the manufacturing-induced corner rounding on the performance of the plurality of active area test structures.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

forming a plurality of test structures on a semiconducting substrate, each of said test structures having a first member and a second member at least partially overlapping the first member, wherein at least one physical dimension of each test structure associated with the overlapping varies relative to the other of said plurality of test structures to affect the proximity of one of the first and second members in the particular one of the plurality of test structures to a region of manufacturing-induced corner rounding present at an inside corner defined in the other of the first and second members in the particular one of the test structures;

forming at least one reference test structure;

performing at least one electrical test on said plurality of test structures and on said at least one reference test structure to thereby produce electrical test results; and analyzing said test results to determine an impact of said manufacturing-induced corner rounding on the performance of said plurality of test structures.

2. The method of claim 1, wherein said plurality of test structures and said at least one reference test structure are formed on the same substrate.

3. The method of claim 1, wherein said plurality of test structures comprise a plurality of test structures for testing said impact of said manufacturing-induced corner rounding on a gate electrode structure.

4. The method of claim 1, wherein said plurality of test structures comprise a plurality of test structures for testing said impact of said manufacturing-induced corner rounding on an active area.

5. The method of claim 1, wherein said plurality of test structures comprise a plurality of test structures for testing said impact of said manufacturing-induced corner rounding on a gate electrode structure and an active area.

6. The method of claim 1, wherein said plurality of test structures and said at least one reference test structure are formed on the same semiconducting substrate.

7. A method, comprising:

forming a plurality of test structures on a semiconducting substrate, each of said test structures having a first member and a second member at least partially overlapping the first member, wherein at least one physical dimension of each test structure associated with the overlapping varies relative to the other of said plurality of test structures to affect the proximity of one of the first and second members in the particular one of the plurality of test structures to a region of manufacturing-induced corner rounding present at an inside corner defined in the other of the first and second members in the particular one of the plurality of test structures;

forming a plurality of reference test structures;

performing at least one electrical test on said plurality of test structures and on said plurality of reference test structures to thereby produce electrical test results; and analyzing said test results to determine an impact of said manufacturing-induced corner rounding on the performance of said plurality of test structures.

8. The method of claim 7, wherein said plurality of test structures and said plurality of reference test structures are formed on the same substrate.

9. The method of claim 7, wherein said plurality of test structures comprise a plurality of test structures for testing said impact of said manufacturing-induced corner rounding on a gate electrode structure.

10. The method of claim 7, wherein said plurality of test structures comprise a plurality of test structures for testing said impact of said manufacturing-induced corner rounding on an active area.

11. The method of claim 7, wherein said plurality of test structures comprise a plurality of test structures for testing said impact of said manufacturing-induced corner rounding on a gate electrode structure and an active area.

12. The method of claim 7, wherein said plurality of test structures and said plurality of reference test structures are formed on the same semiconducting substrate.

13. A method, comprising:

forming a plurality of gate electrode test structures on a semiconducting substrate for testing an impact of corner rounding resulting from manufacturing operations, each of said gate electrode test structures having at least one physical dimension that varies relative to the other of said plurality of gate electrode test structures, at least some of said gate electrode test structures exhibiting manufacturing-induced corner rounding at a first inside corner defined in said gate electrode test structures;

forming a plurality of active area test structures on a semiconducting substrate for testing an impact of corner rounding resulting from manufacturing operations, each of said active area test structures having at least one physical dimension that varies relative to the other of said plurality of active area test structures, at least some of said active area test structures exhibiting manufacturing-induced corner rounding at a second inside corner defined in said active area test structures, wherein the physical dimensions of the gate electrode test structures and the active area test structures are varied to affect the spacing between the gate electrode structures and the active area structures relative to one of the first and second inside corners;

forming at least one reference test structure;

performing at least one electrical test on said plurality of gate electrode test structures, said plurality of active area test structures, and on said at least one reference test structure to thereby produce electrical test results;

analyzing said test results to determine an impact of said manufacturing-induced corner rounding on the performance of said plurality of gate electrode test structures; and analyzing said test results to determine an impact of said manufacturing-induced corner rounding on the performance of said plurality of active area test structures.

14. The method of claim 13, wherein said plurality of gate electrode test structures, said plurality of active area test structures, and said at least one reference test structure are formed on the same substrate.

15. The method of claim 13, wherein forming said at least one reference test structure comprises forming a plurality of reference test structures.

16. The method of claim 13, wherein forming said at least one reference test structure comprises forming a plurality of reference test structures on the same semiconducting substrate.

* * * * *

UNITED STATES PATENT AND TRADEMARK OFFICE
CERTIFICATE OF CORRECTION

| | |
|---|---|
| PATENT NO. | : 7,504,270 B2 |
| APPLICATION NO. | : 11/425913 |
| DATED | : March 17, 2009 |
| INVENTOR(S) | : David D. Wu et al. |

Page 1 of 1

It is certified that error appears in the above-identified patent and that said Letters Patent is hereby corrected as shown below:

Col. 7, line 2 (claim 1, line 9), delete "the particular" and insert therefor -- a particular --.

Col. 7, line 41 (claim 7, line 9), delete "the particular" and insert therefor -- a particular --.

Signed and Sealed this

Twenty-first Day of April, 2009

JOHN DOLL
*Acting Director of the United States Patent and Trademark Office*